(12) United States Patent
Nishiwaki

(10) Patent No.: US 9,692,524 B2
(45) Date of Patent: Jun. 27, 2017

(54) ULTRASONIC TRANSDUCER DEVICE, PROBE, ELECTRONIC INSTRUMENT, AND ULTRASONIC DIAGNOSTIC DEVICE

(71) Applicant: SEIKO EPSON CORPORATION, Tokyo (JP)

(72) Inventor: Tsutomu Nishiwaki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 115 days.

(21) Appl. No.: 14/929,875

(22) Filed: Nov. 2, 2015

(65) Prior Publication Data

US 2016/0056901 A1    Feb. 25, 2016

Related U.S. Application Data

(63) Continuation of application No. 13/770,153, filed on Feb. 19, 2013, now Pat. No. 9,197,331.

(30) Foreign Application Priority Data

Feb. 24, 2012   (JP) ................. 2012-038401

(51) Int. Cl.
*H04B 11/00* (2006.01)
*H04R 29/00* (2006.01)
*B06B 1/06* (2006.01)
*H01L 41/047* (2006.01)

(52) U.S. Cl.
CPC ............ *H04B 11/00* (2013.01); *B06B 1/0629* (2013.01); *H04R 29/008* (2013.01); *H01L 41/0475* (2013.01)

(58) Field of Classification Search
CPC ... H04B 11/00; B06B 1/0629; H01L 41/0475; H04R 29/008
See application file for complete search history.

(56) References Cited

U.S. PATENT DOCUMENTS

| 7,427,797 | B2  |  9/2008 | Ohguro et al. |
| 8,536,763 | B2* | 9/2013  | Nakamura ............. G10K 9/122 310/322 |
| 9,197,331 | B2* | 11/2015 | Nishiwaki ............. H04B 11/00 |
| 2005/0154310 | A1 | 7/2005 | Bruestle |
| 2005/0154311 | A1 | 7/2005 | Bruestle |
| 2005/0154312 | A1 | 7/2005 | Bruestle |
| 2007/0299345 | A1 | 12/2007 | Adachi et al. |
| 2011/0060225 | A1 | 3/2011 | Cogan et al. |

(Continued)

FOREIGN PATENT DOCUMENTS

| CN | 103356232 A | 10/2013 |
| JP | 64-008978 U | 1/1989 |

(Continued)

*Primary Examiner* — Daniel Pihulic
(74) *Attorney, Agent, or Firm* — Global IP Counselors, LLP

(57) ABSTRACT

An ultrasonic transducer device includes a first substrate, a plurality of ultrasonic transducer elements, a second substrate and a wiring member. The first substrate defines a plurality of openings arranged in an array pattern. Each of the ultrasonic transducer elements is provided in each of the openings in a plan view. The second substrate includes a first wiring part, and coupled to the first substrate. The wiring member includes a second wiring part electrically connecting the ultrasonic transducer elements to the first wiring part.

20 Claims, 9 Drawing Sheets

(56) References Cited

U.S. PATENT DOCUMENTS

| | | |
|---|---|---|
| 2011/0115337 A1 | 5/2011 | Nakamura et al. |
| 2011/0198968 A1 | 8/2011 | Sato et al. |
| 2011/0213592 A1 | 9/2011 | Adachi et al. |
| 2011/0221306 A1 | 9/2011 | Matsuda |
| 2012/0174672 A1 | 7/2012 | Tsuruno et al. |
| 2012/0247217 A1 | 10/2012 | Suzuki |
| 2013/0066209 A1 | 3/2013 | Matsuda |
| 2013/0223184 A1 | 8/2013 | Takahashi |
| 2013/0223192 A1 | 8/2013 | Nishiwaki |
| 2013/0261465 A1 | 10/2013 | Nakamura et al. |
| 2013/0331978 A1 | 12/2013 | Suzuki |
| 2013/0342810 A1 | 12/2013 | Nishiwaki |
| 2014/0059821 A1 | 3/2014 | Matsuda |
| 2014/0066778 A1 | 3/2014 | Nishiwaki |
| 2014/0104989 A1 | 4/2014 | Matsuda |
| 2014/0116139 A1 | 5/2014 | Endo |
| 2014/0116140 A1 | 5/2014 | Endo |
| 2014/0116147 A1 | 5/2014 | Endo |
| 2014/0116148 A1 | 5/2014 | Endo |
| 2014/0211592 A1 | 7/2014 | Miyazawa |
| 2014/0241112 A1 | 8/2014 | Kano |
| 2014/0267504 A1 | 9/2014 | Ohashi et al. |
| 2014/0292941 A1 | 10/2014 | Kobayashi et al. |
| 2015/0027228 A1 | 1/2015 | Endo |
| 2015/0029818 A1 | 1/2015 | Endo |
| 2015/0052715 A1 | 2/2015 | Takabe et al. |
| 2015/0112201 A1 | 4/2015 | Nakanishi et al. |
| 2015/0119717 A1 | 4/2015 | Yoshida et al. |
| 2015/0141825 A1 | 5/2015 | Kiyose |
| 2015/0150533 A1 | 6/2015 | Nakamura et al. |
| 2016/0056901 A1* | 2/2016 | Nishiwaki .............. H04B 11/00 367/13 |

FOREIGN PATENT DOCUMENTS

| | | |
|---|---|---|
| JP | 2005-199067 A | 7/2005 |
| JP | 2006-122188 A | 5/2006 |
| JP | 2006-140271 A | 6/2006 |
| JP | 2010-164331 A | 7/2010 |
| JP | 2010-165028 A | 7/2010 |
| JP | 2010-165029 A | 7/2010 |
| JP | 2010-218365 A | 9/2010 |
| JP | 2010-233224 A | 10/2010 |
| JP | 2010-244119 A | 10/2010 |
| JP | 2011-056258 A | 3/2011 |
| JP | 2011-082624 A | 4/2011 |
| JP | 2011-124973 A | 6/2011 |
| JP | 2011-211164 A | 10/2011 |
| JP | 2012-010158 A | 1/2012 |
| WO | 2011/139602 A2 | 11/2011 |

* cited by examiner

ULTRASONIC TRANSDUCER DEVICE, PROBE, ELECTRONIC INSTRUMENT, AND ULTRASONIC DIAGNOSTIC DEVICE

CROSS-REFERENCE TO RELATED APPLICATIONS

This application claims priority to Japanese Patent Application No. 2012-038401 filed on Feb. 24, 2012. The entire disclosure of Japanese Patent Application No. 2012-038401 is hereby incorporated herein by reference.

BACKGROUND

Technical Field

The present invention relates to an ultrasonic transducer device that has a substrate in which openings are provided in an array pattern and an ultrasonic transducer element provided in each opening, a probe that uses the ultrasonic transducer device, and an electronic instrument and an ultrasonic diagnostic device that use the probe.

Related Art

As disclosed in Japanese Laid-Open Patent Publication No. 2011-82624, for example, an ultrasonic transducer element chip is provided with a substrate. A plurality of openings are formed in the substrate. An ultrasonic transducer element is provided in each of the openings.

Japanese Laid-Open Patent Publication No. 2011-56258 discloses a bulk-type ultrasonic transducer element. In the bulk-type ultrasonic transducer element, no opening is formed in a substrate, and the plate thickness of the substrate can be thick. Therefore, the strength of the substrate can be sufficiently obtained. An integrated circuit can be formed on the substrate.

SUMMARY

As described above, when a plurality of openings are formed in a substrate to construct an ultrasonic transducer element chip, the strength of the substrate will be deteriorated. In particular, since an etching process is used for forming an opening, it is preferable that the thickness of a substrate be reduced. When the thickness of a substrate is made thin, however, the strength of the substrate will further be deteriorated. Forming an integrated circuit on such a substrate has not yet been proposed.

According to at least one aspect of the present invention, an ultrasonic transducer element chip whose thickness is securely reduced to connect an integrated circuit can be provided.

An ultrasonic transducer device according to one aspect includes a first substrate, a plurality of ultrasonic transducer elements, a second substrate and a wiring member. The first substrate defines a plurality of openings arranged in an array pattern. Each of the ultrasonic transducer elements is provided in each of the openings in a plan view. The second substrate includes a first wiring part, and coupled to the first substrate. The wiring member includes a second wiring part electrically connecting the ultrasonic transducer elements to the first wiring part.

BRIEF DESCRIPTION OF THE DRAWINGS

Referring now to the attached drawings which form a part of this original disclosure.

DETAILED DESCRIPTION OF EXEMPLARY EMBODIMENTS

Next, embodiments of the present invention will be explained with reference to the attached drawings. The embodiments explained below shall not be construed as unreasonably limiting the subject matter of the present invention described in the claims, and all the elements explained in the embodiments are not necessarily essential to the solving means of the present invention.

(1) Overall Configuration of Ultrasonic Diagnostic Device

Figure 1:
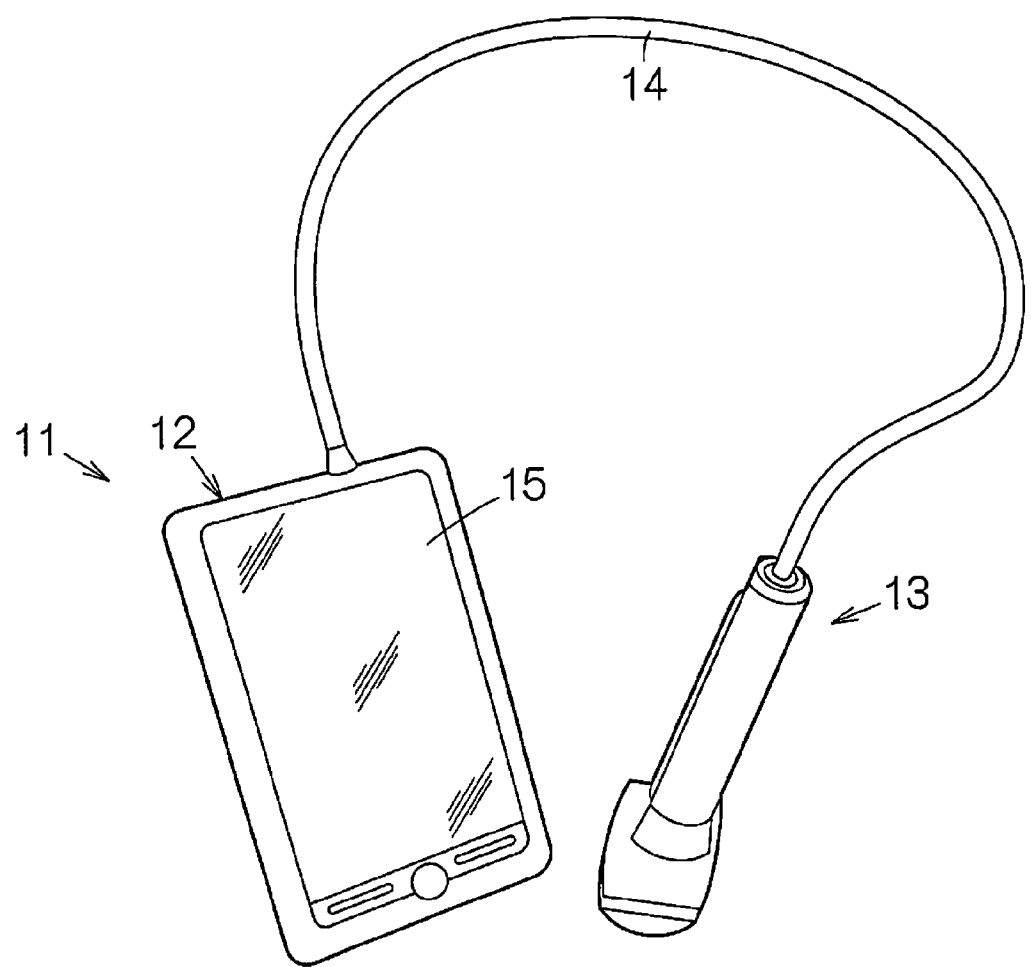
FIG. 1 is a perspective view schematically showing an example of an electronic instrument, that is, an ultrasonic diagnostic device according to one embodiment of the present invention.

FIG. 1 schematically shows a configuration of an ultrasonic diagnostic device (one example of an ultrasonic detecting device) 11 as an example of an electronic instrument according to an embodiment of the present invention. The ultrasonic diagnostic device 11 is provided with a device terminal 12 and an ultrasonic probe (one example of a probe) 13. The device terminal 12 and the ultrasonic probe 13 are connected to each other through a cable 14. The device terminal 12 and the ultrasonic probe 13 communicate an electric signal through the cable 14. A display panel (one example of a display device) 15 is incorporated in the device terminal 12. A screen of the display panel 15 is exposed on a surface of the device terminal 12. As described later, in the device terminal 12, an image is generated based on ultrasonic waves detected with the ultrasonic probe 13. Imaged detection results are displayed on the screen of the display panel 15.

Figure 2:
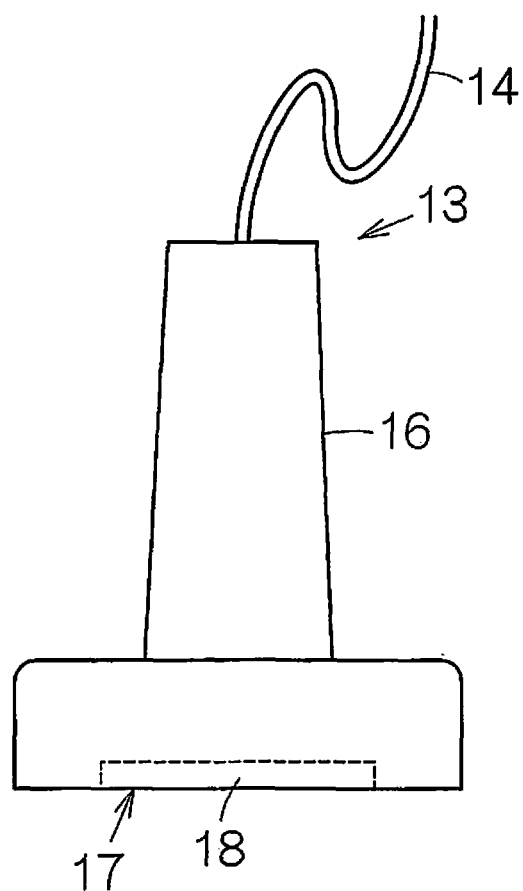
FIG. 2 is an enlarged front view of an ultrasonic probe.

As shown in FIG. 2, the ultrasonic probe 13 has a case 16. An ultrasonic transducer element chip unit (hereinafter referred to as "chip unit") 17 is accommodated in the case 16. The chip unit 17 has an ultrasonic transducer element chip (hereinafter referred to as "element chip") 18. A surface of the element chip 18 may be exposed on a surface of the case 16. The element chip 18 outputs ultrasonic waves from the surface thereof, and receives reflected waves of ultrasonic waves.

Figure 3:
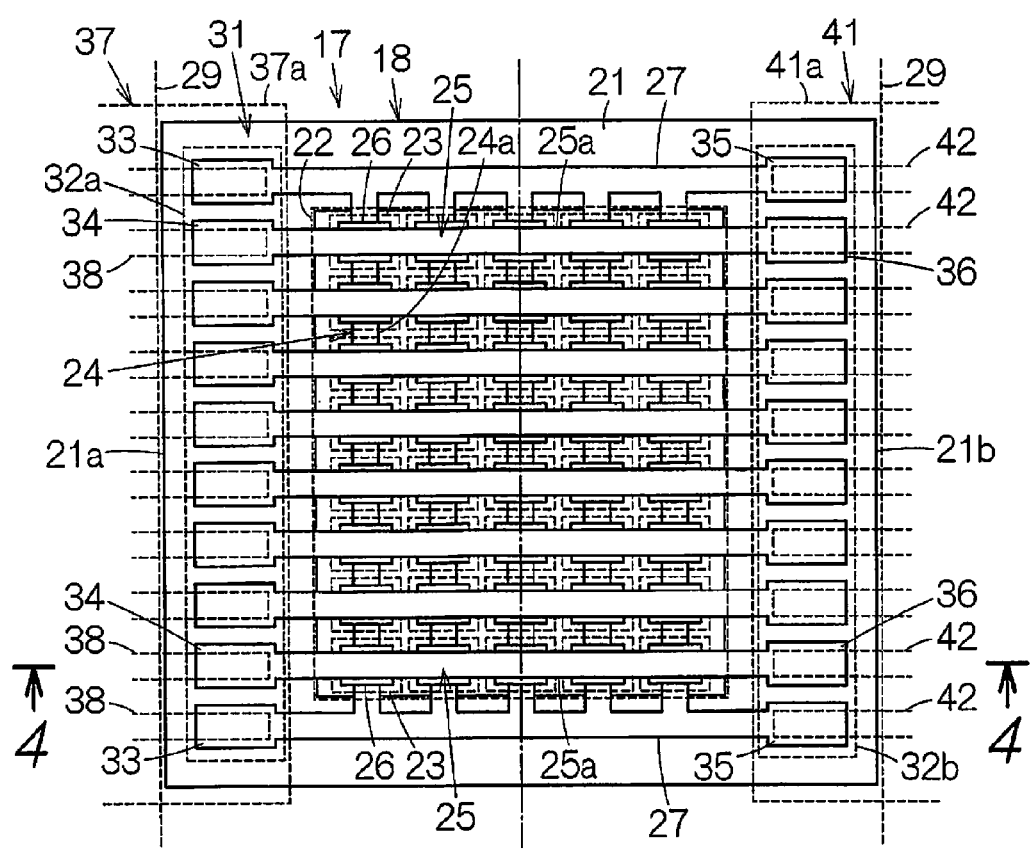
FIG. 3 is an enlarged plan view of an ultrasonic transducer element chip unit.

FIG. 3 schematically shows a plan view of the element chip 18. The element chip 18 is provided with a substrate 21 (one example of a first substrate). An element array 22 is formed on a surface (first surface) of the substrate 21. The element array 22 is constructed of ultrasonic transducer elements (hereinafter referred to as "element") 23 arranged in an array pattern. The array is formed in a matrix having a plurality of rows and a plurality of columns. A zigzag pattern may be used in the array. In the zigzag pattern, a group of the elements 23 in an even row may be displaced with respect to a group of the elements 23 in an odd row by one-half of the column pitch. The number of the elements in one of an odd row and an even row may be smaller than the number of the elements in the other of an odd row and an even row by one. Each element 23 has a piezoelectric element section. The piezoelectric element section is constructed of a lower electrode 24, an upper electrode 25, and a piezoelectric film 26. The piezoelectric film 26 is sandwiched between the lower electrode 24 and the upper electrode 25 in each element 23.

The lower electrode 24 has a plurality of first conductive bodies (first electrodes) 24a. The first conductive bodies 24a extend in a column direction of the arrangement in parallel to each other. One first conductive body 24a is assigned to each column of the elements 23. One first conductive body 24a is provided in common with respect to the piezoelectric films 26 of the elements 23 lined up in the column direction of the arrangement. Both ends of the first conductive bodies 24a are connected to a pair of extraction wirings 27, respectively. The extraction wirings 27 extend in a row direction of the arrangement in parallel to each other. All the first conductive bodies 24a have the same length. In this manner, the lower electrode 24 is provided in common with respect to the elements 23 of the entire matrix.

The upper electrode 25 has a plurality of second conductive bodies (second electrodes) 25a. The second conductive bodies 25a extend in the row direction of the arrangement in parallel to each other. One second conductive body 25a is assigned to each row of the elements 23. One second conductive body 25a is provided in common with respect to the piezoelectric films 26 of the elements 23 lined up in the row direction of the arrangement. Power distribution to the elements 23 is switched per row. Line scanning or sector scanning is achieved corresponding to such switching of power distribution. Since the elements 23 in one row output ultrasonic waves at the same time, the number of the elements 23 in one row, that is, the number of the columns in the arrangement can be determined based on the output level of ultrasonic waves. For example, the number of the columns may be set to be around 10-15. In the drawing, five columns are illustrated for simplicity. The row number of the arrangement can be determined based on the extent of an area to be scanned. For example, the row number may be set to be 128 or 256. In the drawing, eight rows are illustrated for simplicity.

The outline of the substrate 21 has a first side 21a and a second side 21b that are opposed and partitioned by a pair of straight lines 29 in parallel to each other. A peripheral region 31 extends between the outer periphery of the element array 22 and the outline of the substrate 21. In the peripheral region 31, one line of a first terminal array 32a is formed along the first side 21a in parallel to the first side 21a, and one line of a second terminal array 32b is formed along the second side 21b in parallel to the second side 21b. The first terminal array 32a is constructed of a pair of lower electrode terminals 33 and a plurality of upper electrode terminals 34. Similarly, the second terminal array 32b is constructed of a pair of lower electrode terminals 35 and a plurality of upper electrode terminals 36. The lower electrode terminal 33 and the lower electrode terminal 35 are connected to both ends of each of the extraction wiring 27, respectively. It is sufficient for the extraction wirings 27, the lower electrode terminals 33 and the lower electrode terminals 35 to be formed plane-symmetrically with respect to a vertical plane that bisects the element array 22. The upper electrode terminal 34 and the upper electrode terminal 36 are connected to both ends of each of the second conductive bodies 25a, respectively. It is sufficient for the second conductive bodies 25a, the upper electrode terminals 34 and the upper electrode terminals 36 to be formed plane-symmetrically with respect to the vertical plane that bisects the element array 22. The outline of the substrate 21 is formed to be a rectangle. The outline of the substrate 21 may be a square or a trapezoid.

The chip unit 17 has a first flexible printed circuit board 37 and a second flexible printed circuit board 41. The first flexible printed circuit board 37 is coupled with the substrate 21. The first flexible printed circuit board 37 covers the first terminal array 32a for the coupling. Conductive lines, that is, first signal lines (one example of a second wiring part) 38 are formed at a first end 37a of the first flexible printed circuit board 37 corresponding to the lower electrode terminals 33 and the upper electrode terminals 34, respectively. The first signal lines 38 are respectively opposed to the lower electrode terminals 33 and the upper electrode terminals 34, and respectively bonded thereto. Similarly, the second flexible printed circuit board 41 is coupled with the substrate 21. The second flexible printed circuit board 41 covers the second terminal array 32b for the coupling. Conductive lines, that is, second signal lines (one example of a second wiring part) 42 are formed at a first end 41a of the second flexible printed circuit board 41 corresponding to the lower electrode terminals 35 and the upper electrode terminals 36, respectively. The second signal lines 42 are respectively opposed to the lower electrode terminals 35 and the upper electrode terminals 36, and respectively bonded thereto.

Figure 4:
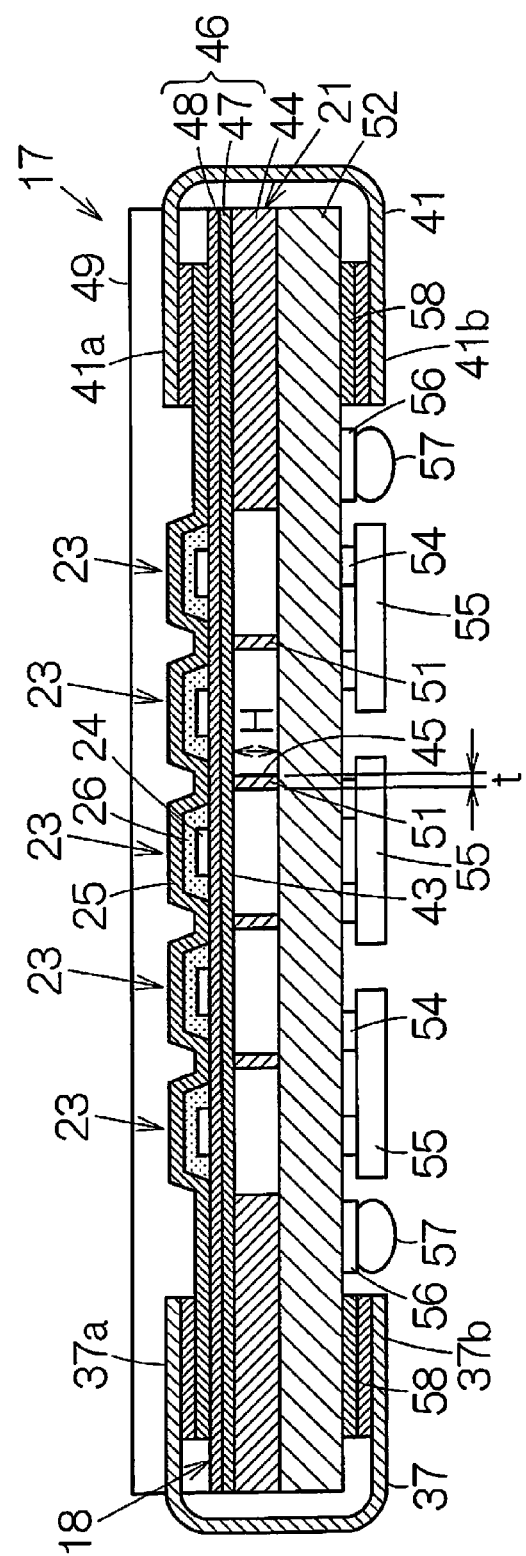
FIG. 4 is a sectional view along line 4-4 of FIG. 3.

As shown in FIG. 4, each of the elements 23 has a vibrating film 43. In order to achieve the vibrating film 43, an opening 45 is formed in each of the elements 23 on a substrate base 44 of the substrate 21. The openings 45 are arranged in an array pattern with respect to the substrate base 44. A flexible film 46 is formed all over a surface of the substrate base 44. The flexible film 46 is constructed of a silicon oxide ($SiO_2$) layer 47 layered on the surface of the substrate base 44, and a zirconium oxide ($ZrO_2$) layer 48 layered on a surface of the silicon oxide layer 47. The flexible film 46 contacts the openings 45. In this manner, a part of the flexible film 46 serves as the vibrating film 43 corresponding to the outline of the opening 45. The film thickness of the silicon oxide layer 47 can be determined based on the resonance frequency. The outline of the element 23 is defined by the outline of the opening 45. The outline of the element array 22 can be defined by the outline of the array of the openings 45.

The lower electrode 24, the piezoelectric film 26, and the upper electrode 25 are layered on a surface of the vibrating film 43 in this order. As for the lower electrode 24, a layered film of titanium (Ti), iridium (Ir), platinum (Pt), and titanium (Ti) can be used, for example. The piezoelectric film 26 may be formed of piezoelectric zirconate titanate (PZT), for example. The upper electrode 25 may be formed of iridium (Ir), for example. Another conductive material may be used for the lower electrode 24 and the upper electrode 25. Another piezoelectric material may be used for the piezoelectric film 26. The piezoelectric film 26 completely covers the lower electrode 24 under the upper electrode 25. The function of the piezoelectric film 26 prevents short circuit between the upper electrode 25 and the lower electrode 24 from occurring.

A protective film 49 is layered on the surface of the substrate 21. The protective film 49 covers, for example, the entire surface of the substrate 21. As a result, the protective film 49 covers the element array 22, the first terminal array 32a, the second terminal array 32b, the first end 37a of the first flexible printed circuit board 37, and the first end 41a of the second flexible printed circuit board 41. For example, a silicone resin film may be used for the protective film 49. The protective film 49 protects the structure of the element array 22, the bonding of the first terminal array 32a and the first flexible printed circuit board 37, and the bonding of the second terminal array 32b and the second flexible printed circuit board 41.

A partition wall 51 is laid out between the adjacent openings 45. The openings 45 are partitioned by the partition wall 51. The distance between the openings 45 corresponds to a thickness "t" of the partition wall 51. The depth of the opening 45 corresponds to a height "H" of the partition wall 51. When the thickness "t" of the partition wall 51 is decreased, the arrangement density of the vibrating film 43 can be increased. This can contribute to size reduction of the element chip 18. When the height "H" of the partition wall 51 is larger than the thickness "t" of the partition wall 51, the bending rigidity of the element chip 18 can be increased. Consequently, the distance between the openings 45 is set to be smaller than the depth of the opening 45.

A wiring substrate 52 (one example of a second substrate) is fixed to a reverse surface (second surface) of the substrate 21. The reverse surface of the substrate 21 is overlapped on a surface (first surface) of the wiring substrate 52. The wiring substrate 52 closes the openings 45 in the reverse surface of the substrate 21. The wiring substrate 52 may have a rigid base material. For example, the wiring substrate 52 may be formed of a silicon base plate. The plate thickness of the substrate base 44 is set to be around 100 μm, and the plate thickness of the wiring substrate 52 is set to be around 100-150 μm. The partition walls 51 are bonded to the wiring substrate 52. It is sufficient that the surfaces are bonded.

A first wiring 54 (one example of a first wiring part) is formed on a reverse surface (second surface) of the wiring substrate 52. The first wiring 54 can be made of a thin film of a conductive material. A metal material such as copper can be used as the conductive material. The thin film can draw a wiring pattern on the reverse surface of the wiring substrate 52.

An integrated circuit (IC) chip 55 is mounted on the reverse surface of the wiring substrate 52. The integrated circuit chip 55 constructs the integrated circuit. The integrated circuit is connected to the first wiring 54.

Figure 5:
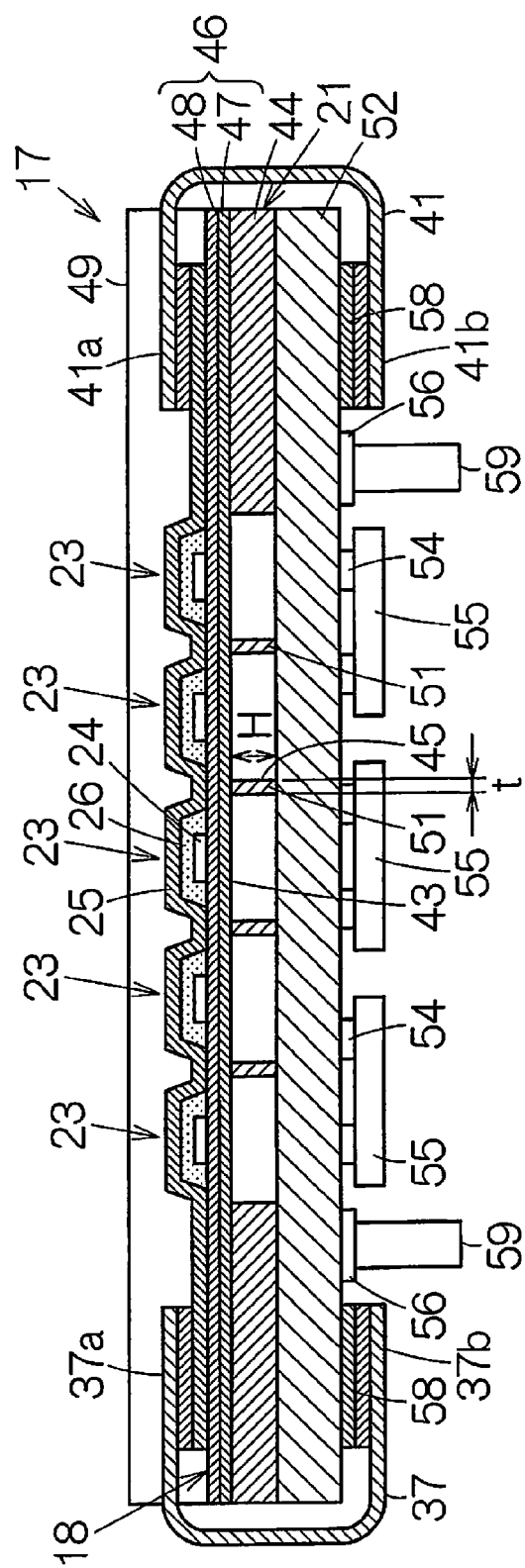
FIG. 5 is an enlarged sectional view of an ultrasonic transducer element chip unit according to a modification example corresponding to FIG. 4.

An external connection terminal 56 is formed on the reverse surface of the wiring substrate 52. The external connection terminal 56 is connected to the first wiring 54. The external connection terminal 56 can be made of a conductive material having a pad shape, for example. A metal material such as copper can be used as the conductive material. A bump 57 of a conductive material may be bonded to the external connection terminal 56. The external connection terminal 56 is connected to the integrated circuit through the first wiring 54. A signal line of the cable 14 is bonded to the external connection terminal 56. Also, as shown in FIG. 5, a connector 59 can be provided on the reverse surface of the wiring substrate 52 instead of the external connection terminal 56. The connector 59 is connected to the first wiring 54. The connector 59 can be bonded to a receiver connector (not shown in the drawing) in the case 16. One end of the cable 14 can be bonded to the receiver connector.

The first flexible printed circuit board 37 and the second flexible printed circuit board 41 are individually supported on the wiring substrate 52. In order the first flexible printed circuit board 37 and the second flexible printed circuit board 41 to be supported, the first flexible printed circuit board 37 and the second flexible printed circuit board 41 are coupled to the reverse surface of the wiring substrate 52. A relay terminal 58 is formed on the reverse surface of the wiring substrate 52. The relay terminal 58 is connected to the first wiring 54. A second end 37b of the first flexible printed circuit board 37 and a second end 41b of the second flexible printed circuit board 41 cover the relay terminals 58, respectively. The first signal lines 38 and the second signal lines 42 are connected to the relay terminals 58, respectively. The first signal lines 38 and the second signal lines 42 are bonded to the relay terminals 58 by soldering or a conductive adhesive. In this manner, the first signal lines 38 and the second signal lines 42 establish electrical continuity at least between the element array 22 on the substrate 21 and the first wiring 54.

(2) Circuit Configuration of Ultrasonic Diagnostic Device

Figure 6:
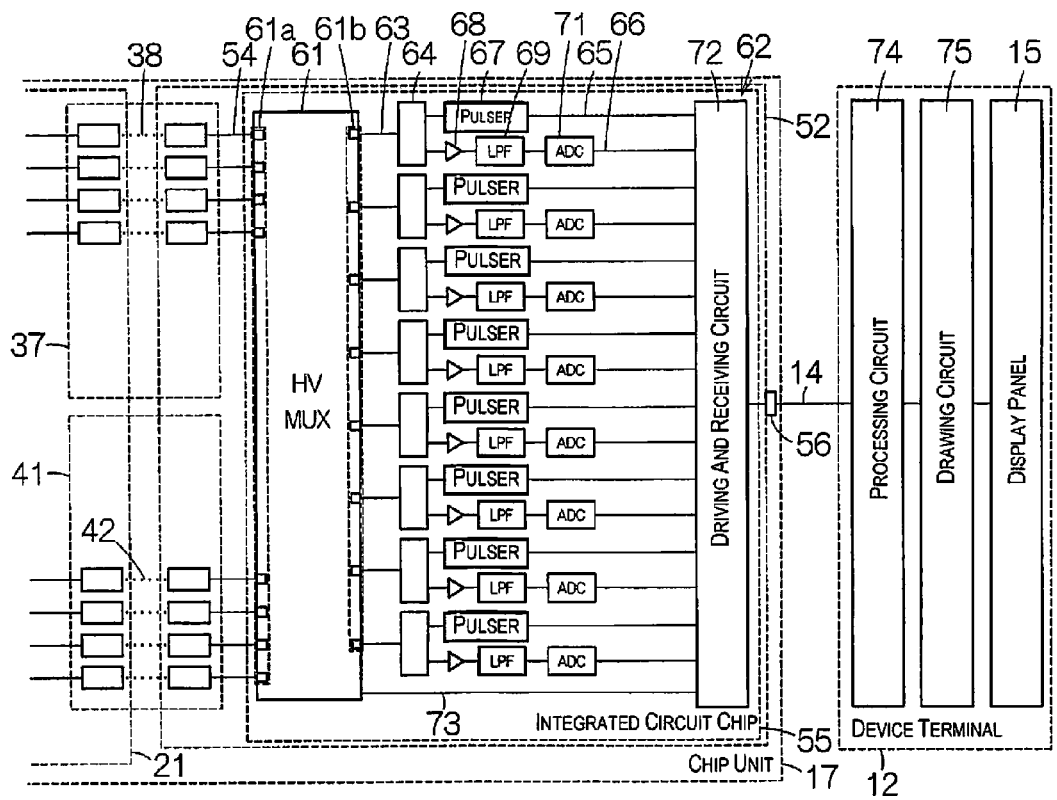
FIG. 6 is a block diagram schematically showing a circuit configuration of the ultrasonic diagnostic device.

As shown in FIG. 6, the integrated circuit has a multiplexer 61, and a transmitting and receiving circuit 62. The multiplexer 61 has a group of ports 61a on the element 23 side, and a group of ports 61b on a signal processing side. The first signal lines 38 and the second signal lines 42 are connected to the group of ports 61a on the element 23 side via the first wiring 54. In this manner, the group of ports 61a is connected to the element array 22. Signal lines 63 are connected to the group of ports 61b on the signal processing side, and the number of the signal lines 63 is a prescribed number of the transmitting and receiving circuit 62. The prescribed number corresponds to a number of the elements 23 aligned in a row that output at the same time as scanning is conducted. The multiplexer 61 controls interconnection between the ports on the element 23 side and the ports on the signal processing side, that is, on the cable 14 side.

The transmitting and receiving circuit 62 has changing switches 64 of a prescribed number. The changing switches 64 are connected to the corresponding signal lines 63, respectively. The transmitting and receiving circuit 62 has a transmission channel 65 and a reception channel 66 for each of the changing switches 64. The transmission channel 65 and the reception channel 66 are connected to the changing switch 64 in parallel. The changing switch 64 selectively connects the transmission channel 65 and the reception channel 66 to the multiplexer 61. A pulser 67 is incorporated in the transmission channel 65. The pulser 67 outputs a pulse signal at a frequency corresponding to the resonance frequency of the vibrating film 43. An amplifier 68, a low-pass filter (LPF) 69, and an analog-digital converter (ADC) 71 are incorporated in the reception channel 66. A detection signal of each of the elements 23 is amplified, and converted into a digital signal.

The transmitting and receiving circuit 62 has a driving/receiving circuit 72. The transmission channel 65 and the reception channel 66 are connected to the driving/receiving circuit 72. The driving/receiving circuit 72 controls the pulser 67 simultaneously depending on the state of scanning. The driving/receiving circuit 72 receives a digital signal of a detection signal depending on the state of scanning. The driving/receiving circuit 72 is connected to the multiplexer 61 through a control line 73. The multiplexer 61 conducts control of interconnection based on a control signal supplied from the driving/receiving circuit 72.

A processing circuit 74 is incorporated in the device terminal 12. The processing circuit 74 can be provided with a central processing unit (CPU) 74 and a memory, for example. The entire operation of the ultrasonic diagnostic device 11 is controlled in accordance with processing of the processing circuit 74. The processing circuit 74 controls the driving/receiving circuit 72 in accordance with instructions input by a user. The processing circuit 74 generates an image in accordance with a detection signal of the element 23. The image is specified by drawing data.

A drawing circuit 75 is incorporated in the device terminal 12. The drawing circuit 75 is connected to the processing circuit 74. The display panel 15 is connected to the drawing circuit 75. The drawing circuit 75 generates a driving signal in accordance with drawing data generated in the processing circuit 74. The driving signal is sent to the display panel 15. As a result, an image is displayed on the display panel 15.

(3) Operation of Ultrasonic Diagnostic Device

Next, the operation of the ultrasonic diagnostic device 11 will be explained briefly. The processing circuit 74 gives the driving/receiving circuit 72 instructions to transmit and receive ultrasonic waves. The driving/receiving circuit 72 supplies a control signal to the multiplexer 61, and supplies a driving signal to each of the pulsers 67. The pulser 67 outputs a pulse signal in response to the supply of the driving signal. The multiplexer 61 connects the port of the group of ports 61a to the port of the group of ports 61b in response to the instructions of the control signal. The pulse signal is supplied to the elements 23 per row through the lower electrode terminals 33, 35 and the upper electrode terminals 34, 36 in response to the selection of the port. The vibrating film 43 vibrates in response to the supply of the pulse signal. As a result, desired ultrasonic waves are emitted toward a target (for example, the inside of a human body).

After ultrasonic waves are transmitted, the changing switch 64 is switched. The multiplexer 61 maintains the connection relation of the ports. The changing switch 64 establishes a connection between the reception channel 66 and the signal line 63 instead of a connection between the transmission channel 65 and the signal line 63. Reflected waves of ultrasonic waves vibrate the vibrating film 43. As a result, a detection signal is output from the element 23. The detection signal is converted into a digital signal, and sent into the driving/receiving circuit 72.

Transmission and reception of ultrasonic waves are repeated. For repeating transmission and reception of ultrasonic waves, the multiplexer 61 changes the connection relation of the ports. As a result, line scanning or sector scanning is achieved. When scanning is finished, the processing circuit 74 generates an image based on the digital signal of the detection signal. The generated image is displayed on the screen of the display panel 15.

In the chip unit 17, the substrate 21 and the wiring substrate 52 are electrically connected to the first flexible printed circuit board 37 and the second flexible printed circuit board 41. The first flexible printed circuit board 37 and the second flexible printed circuit board 41 are disposed outside the substrate 21 and the wiring substrate 52. A connecting terminal does not need to be provided between the substrate 21 and the wiring substrate 52. As a result, the substrate 21 can be overlapped on the wiring substrate 52. The distance between the substrate 21 and the wiring substrate 52 can be reduced as much as possible. Therefore, the thicknesses of the substrate 21 and the wiring substrate 52 can be reduced to connect an integrated circuit.

In the element chip 18, the wiring substrate 52 is bonded to the reverse surface of the substrate 21. The wiring substrate 52 reinforces the strength of the substrate 21. Even when the plate thickness of the substrate 21 is set to be around 100 μm, for example, the wiring substrate 52 can prevent the substrate 21 from being damaged. On the other hand, in a case where the element array is constructed of a bulk-type ultrasonic transducer element, the plate thickness of the substrate is set to be around 500 μm—several millimeters. Even when the wiring substrate 52 is bonded, the thickness of the element chip 18 can be reduced securely compared to the case where the element array is constructed of a bulk-type ultrasonic transducer element. In addition, since the acoustic impedance of the vibrating film 43 is close to that of a human body compared to a bulk-type ultrasonic transducer element, an acoustic impedance matching layer can be omitted in the element chip 18 unlike in the case of a bulk-type ultrasonic transducer element. Omission of the matching layer can further contribute to making the element chip 18 thinner.

In the element chip 18, the partition walls 51 are bonded to the wiring substrate 52. The rigidity of the partition walls 51 can be increased. As a result, vibration (reverberant vibration) of the partition walls 51 can be controlled. The vibration characteristics of the element 23 can be stabilized. On the other hand, when the thickness "t" of the partition wall 51 is smaller than the height "H", the bending rigidity of the partition wall 51 will be decreased in an in-plane direction of the element chip 18. When the partition walls 51 are not bonded to the wiring substrate 52, the partition walls 51 will easily vibrate in the in-plane direction of the element chip 18. The so-called cross talk will occur.

The integrated circuit is incorporated in the element chip 18. The integrated circuit chip 55 can be connected to the external connection terminal 56 through input and output terminals whose number is smaller than the number of conductive lines connected to the element array 22, that is, the number of the lower electrode terminals 33, 35 and the upper electrode terminals 34, 36. Since the number of the input and output terminals of the integrated circuit chip 55 is smaller than the number of the lower electrode terminals 33, 35 and the upper electrode terminals 34, 36, the size of the cable 14 or the connector connected to the element chip 18 can be reduced. Therefore, the element chip 18 can be accommodated in a narrower space compared to a conventional technique.

The multiplexer 61 is incorporated in the integrated circuit chip 55. The multiplexer 61 controls a connection relation between the group of ports 61a connected to the lower electrode terminals 33, 35 and the upper electrode terminals 34, 36, and the group of ports 61b on the signal processing side whose number is smaller than the number of the lower electrode terminals 33, 35 and the upper electrode terminals 34, 36. Consequently, the multiplexer 61 greatly contributes to size reduction of the cable 14 or the connector connected to the element chip 18.

In addition, the pulser 67 is incorporated in the integrated circuit chip 55. The distance between the element 23 and the pulser 67 can be reduced. It is thus possible to increase the signal-noise ratio of a resonance signal supplied to the element 23 can be increased. The analog-digital converter 71 is incorporated in the integrated circuit chip 55. The distance between the element 23 and the analog-digital converter 71 can be reduced. It is thus possible to increase the signal-noise ratio of a detection signal output from the element 23 can be increased.

In the element chip 18, the external connection terminal 56 is formed on the reverse surface of the wiring substrate 52. Consequently, the chip unit 17 can be handled as a single unit. The external connection terminal 56 can be easily mounted. Further, since the external connection terminal 56 is pulled toward the reverse side of the substrate 21, the wiring substrate 52 can be prevented from expanding along a two-dimensional plane that includes the substrate 21. Consequently, it can contribute to size reduction of the chip unit 17.

In the element chip 18, the lower electrode 24 has the first conductive body 24a. Both ends of the first conductive body 24a are connected to the extraction wiring 27, respectively. A resonance signal is input to the extraction wiring 27 from the lower electrode terminals 33, 35. Since a resonance signal is supplied to the first conductive body 24a from both ends thereof, the influence of voltage decrease can be reduced as much as possible. Likewise, the upper electrode 25 has the second conductive body 25a. Both ends of the second conductive body 25a are connected to the upper electrode terminals 34, 36, respectively. Therefore, a resonance signal is supplied to the second conductive body 25a from the upper electrode terminals 34, 36 on both ends thereof. The influence of voltage decrease can be reduced as much as possible.

(4) Configuration of Chip Unit According to Second Embodiment

Figure 7:
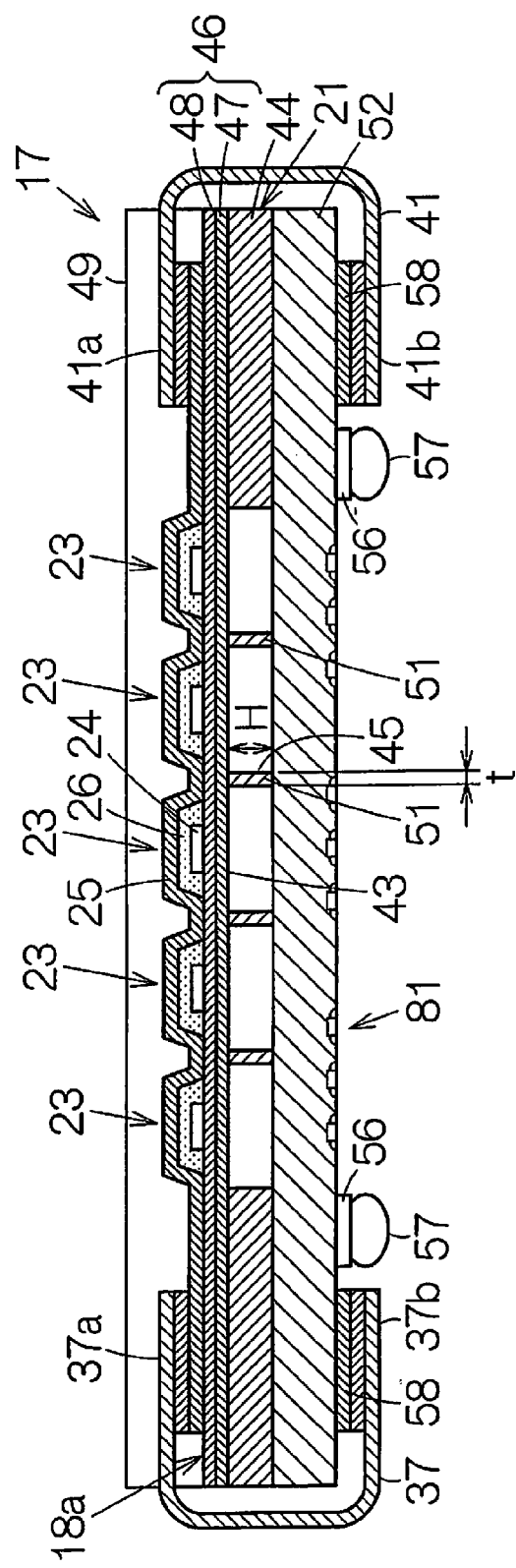
FIG. 7 is a sectional view of an ultrasonic transducer element chip unit according to a second embodiment corresponding to FIG. 3.

FIG. 7 schematically shows a configuration of the chip unit 17 according to a second embodiment of the present invention. The ultrasonic diagnostic device 11 can use an element chip 18a instead of the above-described element chip 18. In the second embodiment, the above-described integrated circuit is constructed of a monolithic integrated circuit 81 formed on the reverse surface of the wiring substrate 52 instead of the integrated circuit chip 55 of the first embodiment. Since the monolithic integrated circuit 81 is formed on the reverse surface of the wiring substrate 52, it can contribute to size reduction of the element chip 18a.

Although not illustrated in FIG. 7, the first wiring is formed on a reverse surface (second surface) of the wiring substrate 52 as in the first embodiment, and the monolithic integrated circuit 81, the external connection terminals 56, the relay terminals 58 are connected to the first wiring.

The other configurations of the second embodiment are similar to those of the first embodiment. The configurations or structures of the second embodiment that are equivalent to those of the first embodiment are given the same reference numerals and the overlapping explanations are omitted.

(5) Configuration of Chip Unit According to Third Embodiment

Figure 8:
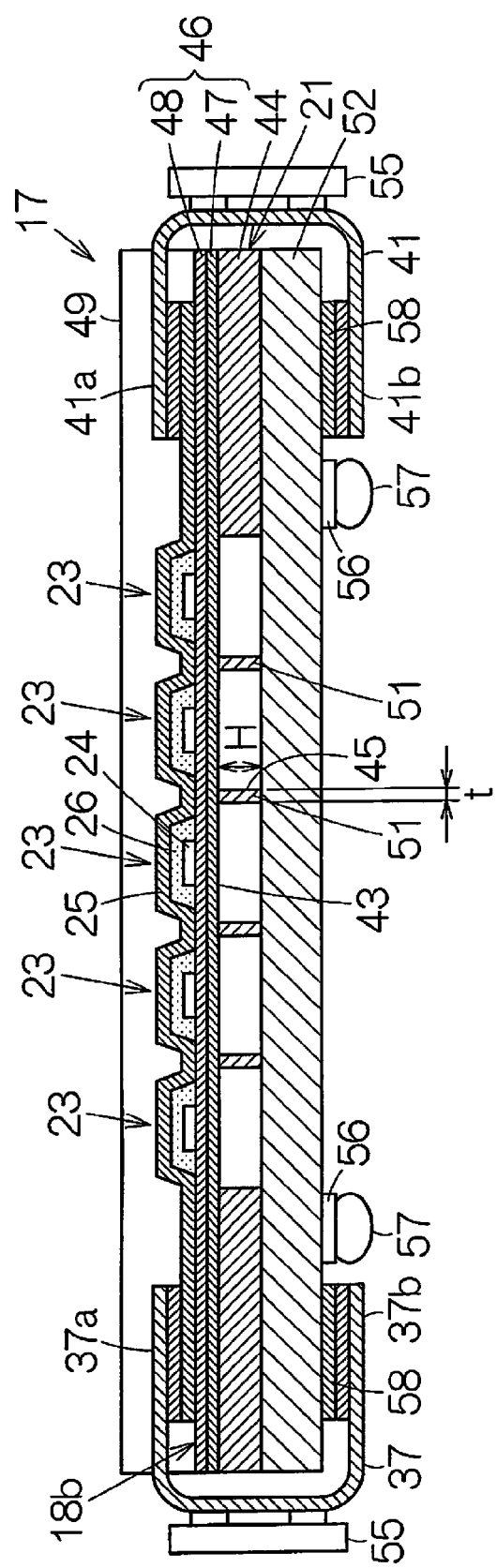
FIG. 8 is a sectional view of an ultrasonic transducer element chip unit according to a third embodiment corresponding to FIG. 3.

FIG. 8 schematically shows a configuration of the chip unit 17 according to a third embodiment of the present invention. The ultrasonic diagnostic device 11 can use an element chip 18b instead of the above-described element chip 18. In the third embodiment, the integrated circuit chip 55 mounted on the first flexible printed circuit board 37 and (or) the second flexible printed circuit board 41. The integrated circuit chip 55 is connected to the conductive line of the first flexible printed circuit board 37 on the first flexible printed circuit board 37. The integrated circuit chip 55 is connected to the conductive line of the second flexible printed circuit board 41 on the second flexible printed circuit board 41. Since the integrated circuit chip 55 does not expand along a two-dimensional plane that includes the substrate 21, it can contribute to size reduction of the element chip 18b.

Although not illustrated in FIG. 8, the first wiring is formed on a reverse surface (second surface) of the wiring substrate 52 as in the first embodiment, and the external connection terminals 56 and the relay terminals 58 are connected to the first wiring.

The other configurations of the third embodiment are similar to those of the first embodiment and the second embodiment. The configurations or structures of the third embodiment that are equivalent to those of the first embodiment and the second embodiment are given the same reference numerals and the overlapping explanations are omitted.

(6) Configuration of Chip Unit According to Fourth Embodiment

Figure 9:
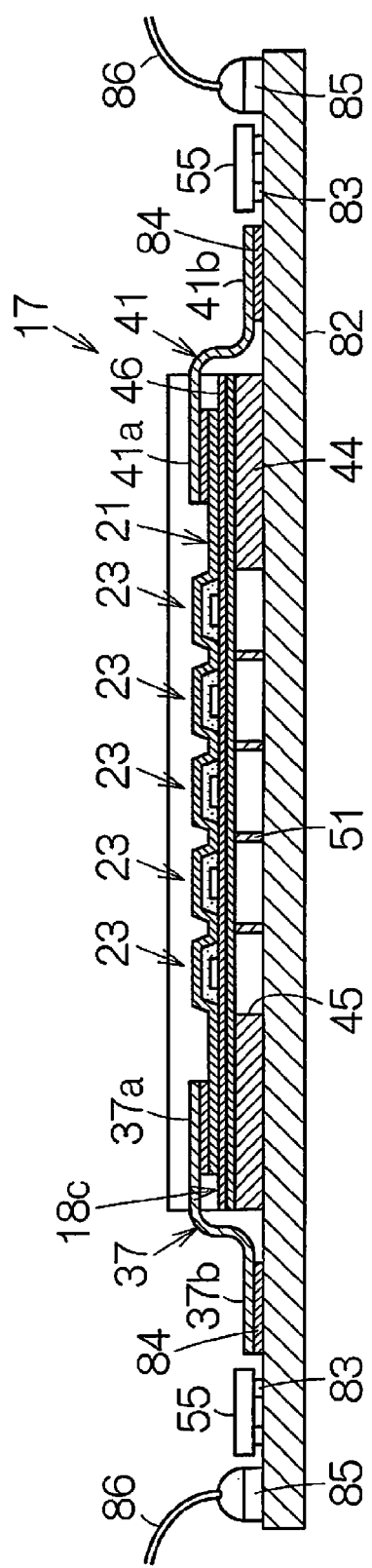
FIG. 9 is a sectional view of an ultrasonic transducer element chip unit according to a fourth embodiment corresponding to FIG. 3.

FIG. 9 schematically shows a configuration of the chip unit 17 according to a fourth embodiment of the present invention. The ultrasonic diagnostic device 11 can use an element chip 18c instead of the above-described element chip 18. In the fourth embodiment, a wiring substrate 82 is used instead of the above-described wiring substrate 52. The wiring substrate 82 receives the substrate 21 on the surface thereof. The reverse surface of the wiring substrate 82 is formed to be a flat surface. A first wiring 83 is formed on the surface of the wiring substrate 82. In order to form the first wiring 83, the wiring substrate 82 expands outwardly with respect to the outline of the substrate 21. The first wiring 83 can be made of a thin film of a conductive material. A metal material such as copper can be used as the conductive material. The thin film can draw a wiring pattern on the surface of the wiring substrate 82.

The first flexible printed circuit board 37 and the second flexible printed circuit board 41 are individually supported on the wiring substrate 82. In order the first flexible printed circuit board 37 and the second flexible printed circuit board 41 to be supported, the first flexible printed circuit board 37 and the second flexible printed circuit board 41 are coupled to the surface of the wiring substrate 82. A relay terminal 84 is formed on the surface of the wiring substrate 82. The relay terminal 84 is connected to the first wiring 83. The second end 37b of the first flexible printed circuit board 37 and the second end 41b of the second flexible printed circuit board 41 cover the relay terminals 84, respectively. The first signal lines 38 and the second signal lines 42 are connected to the relay terminals 84, respectively. The first signal lines 38 and the second signal lines 42 are bonded to the relay terminals 84 by soldering or a conductive adhesive. In this manner, the first signal lines 38 and the second signal lines 42 establish electrical continuity at least between the element array 22 on the substrate 21 and the first wiring 83. The integrated circuit chip 55 is mounted on the surface of the wiring substrate 82. The integrated circuit is connected to the first wiring 83.

An external connection terminal 85 is formed on the surface of the wiring substrate 82. The external connection terminal 85 is connected to the first wiring 83. The external connection terminal 85 can be made of a conductive material having a pad shape, for example. A metal material such as copper can be used as the conductive material. The external connection terminal 85 can be bonded to the signal line of the cable 14 through a wire bonding 86, for example. The external connection terminal 85 is connected to the integrated circuit through the first wiring 83.

By employing such an element chip 18c, since an operation of forming the external connection terminal 85, and an operation of connecting the external connection terminal 85 and the first wiring 83 can be conducted on the surface of the wiring substrate 82, the manufacturing processes can be prevented from being complicated. The other configurations of the fourth embodiment are similar to those of the first embodiment to the third embodiment. The configurations or structures of the fourth embodiment that are equivalent to at least one of those of the first embodiment to the third embodiment are given the same reference numerals and the overlapping explanations are omitted.

While the present embodiment has been explained in detail as above, it will be apparent to those skilled in the art that various changes and modifications can be made herein without substantially departing from the subject matter and the effect of the present invention. Therefore, such changes and modifications are included in the scope of the invention. For example, the terms used in the specification or the drawings at least once together with a different term having a broader or similar meaning can be replaced with the different term in any portion of the specification or the drawings. Also, the configurations and the operations of the ultrasonic diagnostic device 11, the ultrasonic probe 13, the chip unit 17, the ultrasonic transducer element 23, the integrated circuit, the processing circuit 74 and the like are not limited to the present embodiment, and various changes and modifications are possible.

An ultrasonic transducer device according to the embodiment includes a substrate, a plurality of ultrasonic transducer elements, a wiring substrate and a wiring member. The substrate defines a plurality of openings arranged in an array pattern. Each of the ultrasonic transducer elements is provided in each of the openings on a first surface of the substrate. The wiring substrate is arranged to face a second surface of the substrate that is opposite from the first surface. The wiring substrate includes a first wiring part. The wiring member is connected to the substrate and the wiring substrate. The wiring member includes a second wiring part electrically connecting the ultrasonic transducer elements to the first wiring part.

With this configuration, the second wiring can be disposed outside the substrate and the wiring substrate. A connecting terminal does not need to be provided between the substrate and the wiring substrate. As a result, the substrate can be overlapped on the wiring substrate. The distance between the substrate and the wiring substrate can be reduced as much as possible. Therefore, the thicknesses of the substrate and the wiring substrate can be reduced to connect an integrated circuit. Further, when the substrate is overlapped on the wiring substrate, the strength of the substrate can be increased. The thickness of the substrate can be securely reduced. In this manner, thickness reduction can be achieved in the ultrasonic transducer device.

The ultrasonic transducer device according to the above described embodiment preferably further includes an integrated circuit connected to the first wiring part. The integrated circuit preferably includes a prescribed number of input and output terminals on a signal processing side, the prescribed number being smaller than a number of conductive lines connected to the ultrasonic transducer elements. Since the number of the input and output terminals on a signal processing side is smaller than the number of the conductive lines connected to the ultrasonic transducer elements, the size of a cable or a connector connected to the ultrasonic transducer device can be reduced. Therefore, the ultrasonic transducer device can be accommodated in a narrower space compared to a conventional technique.

In the ultrasonic transducer device according to the above described embodiment, the integrated circuit preferably includes a multiplexer. The multiplexer controls a connection relation between the conductive lines connected to the ultrasonic transducer element and the input and output terminal on a signal processing side, the number of the input and output terminal being smaller than the number of the conductive lines. Consequently, the multiplexer greatly contributes to size reduction of a cable or a connector connected to the ultrasonic transducer device.

The ultrasonic transducer device according to the above described embodiment preferably further includes an external connection terminal arranged on a second surface of the wiring substrate that is opposite from a first surface facing the substrate, the external connection terminal being connected to the integrated circuit. Consequently, the ultrasonic transducer device can be handled as a single unit.

In the ultrasonic transducer device according to the above described aspects, the integrated circuit preferably includes an integrated circuit chip mounted on the second surface of the wiring substrate. Since the integrated circuit chip does not expand along a two-dimensional plane that includes the substrate, it can contribute to size reduction of the ultrasonic transducer device.

In the ultrasonic transducer device according to the above described embodiment, the integrated circuit preferably includes a monolithic integrated circuit arranged on the second surface of the wiring substrate. Since the monolithic integrated circuit is formed on the second surface of the wiring substrate, it can contribute to size reduction of the ultrasonic transducer device.

In the ultrasonic transducer device according to the above described embodiment, the wiring member is preferably a flexible printed circuit board including a conductive line including the second wiring part, and the integrated circuit preferably includes an integrated circuit chip mounted on the flexible printed circuit board and connected to the conductive line. Since the integrated circuit chip does not expand along a two-dimensional plane that includes the substrate, it can contribute to size reduction of the ultrasonic transducer device.

The ultrasonic transducer device according to the above described embodiment preferably further includes an external connection terminal arranged on a first surface of the wiring substrate facing the substrate. The external connection terminal is preferably connected to the integrated circuit. Consequently, the ultrasonic transducer device can be handled as a single unit. Further, since an operation of forming the external connection terminal, and an operation of connecting the external connection terminal and the first wiring can be conducted on the first surface of the wiring substrate, the manufacturing processes can be prevented from being complicated.

In the ultrasonic transducer device according to the above described embodiment, the wiring substrate is preferably a plate shaped member layered on the substrate, and a part of the substrate corresponding to a wall between the openings is at least partially fixed to the wiring substrate. The rigidity of the wall can be increased between the openings. As a result, vibration (reverberant vibration) of the wall can be controlled. The vibration characteristics of the ultrasonic transducer element can be stabilized.

The ultrasonic transducer device according to the above described embodiment preferably further includes an integrated circuit connected to the first wiring part. The integrated circuit preferably includes a pulser connected to at least one of the ultrasonic transducer elements. The distance between the ultrasonic transducer element and the pulser can be reduced. It is thus possible to increase the signal-noise ratio of a resonance signal supplied to the ultrasonic transducer element can be increased.

In the ultrasonic transducer device according to the above described embodiment, the integrated circuit preferably includes an analog-digital converter connected to at least one of the ultrasonic transducer elements. The distance between the ultrasonic transducer element and the analog-digital converter can be reduced. It is thus possible to increase the signal-noise ratio of a detection signal output from the ultrasonic transducer element can be increased.

The ultrasonic transducer device according to the above described embodiment preferably further includes an external connection terminal arranged on a second surface of the wiring substrate that is opposite from a first surface facing the substrate. The external connection terminal is preferably connected to the first wiring part. Consequently, the ultrasonic transducer device can be handled as a single unit.

The ultrasonic transducer device according to the above described embodiment preferably further includes an external connection terminal arranged on a first surface of the wiring substrate facing the substrate. The external connection terminal is preferably connected to the first wiring part. Consequently, the ultrasonic transducer device can be handled as a single unit. Further, since an operation of forming the external connection terminal, and an operation of connecting the external connection terminal and the first wiring can be conducted on the first surface of the wiring substrate, the manufacturing processes can be prevented from being complicated.

The ultrasonic transducer device according to the above described embodiment preferably further includes a first electrode arranged on the substrate and extending along the ultrasonic transducer elements aligned in a column direction of the array pattern, and a pair of first electrode terminals arranged on the substrate and connected to both ends of the first electrode, respectively. Signals are input to the electrode from the electrode terminals on both ends thereof. Therefore, the influence of voltage decrease can be reduced as much as possible.

The ultrasonic transducer device according to the above described embodiment preferably further includes a second electrode arranged on the substrate and extending along the ultrasonic transducer elements aligned in a row direction of the array pattern, and a pair of second electrode terminals arranged on the substrate and connected to both ends of the second electrode, respectively. Signals are input to the electrode from the electrode terminals on both ends thereof. Therefore, the influence of voltage decrease can be reduced as much as possible.

A probe according to the embodiment includes the ultrasonic transducer device according to the above described embodiment, and a case supporting the ultrasonic transducer device.

An electronic instrument according to the embodiment includes the probe according to the above described embodiment, and a processing circuit connected to the probe, and configured to process output signals from the ultrasonic transducer elements.

An ultrasonic diagnostic device according to the embodiment includes the probe according to the above described embodiment, a processing circuit connected to the probe, and configured to process output signals from the ultrasonic transducer elements, and a display device configured to display the image.

An electronic instrument according to the embodiment includes the ultrasonic transducer device according to the above described aspects.

An ultrasonic diagnostic device according to the embodiment includes the ultrasonic transducer device according to the above described embodiment.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:
1. An ultrasonic transducer device comprising:
a first substrate defining a plurality of openings arranged in an array pattern;
a plurality of ultrasonic transducer elements with each of the ultrasonic transducer elements being provided in each of the openings in a plan view;
a second substrate including a first wiring part, and coupled to the first substrate; and
a wiring member including a second wiring part electrically connecting the ultrasonic transducer elements to the first wiring part.
2. The ultrasonic transducer device according to claim 1, further comprising
an integrated circuit connected to the first wiring part,
the integrated circuit including a prescribed number of input and output terminals on a signal processing side, the prescribed number being smaller than a number of conductive lines connected to the ultrasonic transducer elements.
3. The ultrasonic transducer device according to claim 2, wherein
the integrated circuit includes a multiplexer.
4. The ultrasonic transducer device according to claim 2, further comprising
an external connection terminal arranged on a second surface of the second substrate that is opposite from a first surface facing the first substrate, the external connection terminal being connected to the integrated circuit.

5. The ultrasonic transducer device according to claim 4, wherein
the integrated circuit includes an integrated circuit chip mounted on the second surface of the second substrate.

6. The ultrasonic transducer device according to claim 4, wherein
the integrated circuit includes a monolithic integrated circuit arranged on the second surface of the second substrate.

7. The ultrasonic transducer device according to claim 4, wherein
the wiring member is a flexible printed circuit board including a conductive line including the second wiring part, and
the integrated circuit includes an integrated circuit chip mounted on the flexible printed circuit board and connected to the conductive line.

8. The ultrasonic transducer device according to claim 2, further comprising
an external connection terminal arranged on a first surface of the second substrate facing the first substrate, the external connection terminal being connected to the integrated circuit.

9. The ultrasonic transducer device according to claim 1, wherein
the second substrate is a plate shaped member layered on the first substrate, and
a part of the first substrate corresponding to a wall between the openings is at least partially fixed to the second substrate.

10. The ultrasonic transducer device according to claim 1, further comprising
an integrated circuit connected to the first wiring part,
the integrated circuit including a pulser connected to at least one of the ultrasonic transducer elements.

11. The ultrasonic transducer device according to claim 10, wherein
the integrated circuit includes an analog-digital converter connected to at least one of the ultrasonic transducer elements.

12. The ultrasonic transducer device according to claim 1, further comprising
an external connection terminal arranged on a second surface of the second substrate that is opposite from a first surface facing the first substrate, the external connection terminal being connected to the first wiring part.

13. The ultrasonic transducer device according to claim 1, further comprising
an external connection terminal arranged on a first surface of the second substrate facing the first substrate, the external connection terminal being connected to the first wiring part.

14. The ultrasonic transducer device according to claim 1, further comprising
a first electrode arranged on the first substrate and extending along the ultrasonic transducer elements aligned in a column direction of the array pattern, and
a pair of first electrode terminals arranged on the first substrate and connected to both ends of the first electrode, respectively.

15. The ultrasonic transducer device according to claim 14, further comprising
a second electrode arranged on the first substrate and extending along the ultrasonic transducer elements aligned in a row direction of the array pattern, and
a pair of second electrode terminals arranged on the first substrate and connected to both ends of the second electrode, respectively.

16. A probe comprising:
the ultrasonic transducer device according to claim 1; and
a case supporting the ultrasonic transducer device.

17. An electronic instrument comprising:
the probe according to claim 16; and
a processing circuit connected to the probe, and configured to process output signals from the ultrasonic transducer elements.

18. An ultrasonic diagnostic device comprising:
the probe according to claim 16;
a processing circuit connected to the probe, and configured to process output signals of the ultrasonic transducer element to generate an image; and
a display device configured to display the image.

19. An electronic instrument comprising the ultrasonic transducer device according to claim 1.

20. An ultrasonic diagnostic device comprising the ultrasonic transducer device according to claim 1.

* * * * *